United States Patent
Jones et al.

(10) Patent No.: US 8,901,916 B2
(45) Date of Patent: Dec. 2, 2014

(54) DETECTING MALICIOUS HARDWARE BY MEASURING RADIO FREQUENCY EMISSIONS

(75) Inventors: Phillip D. Jones, Raleigh, NC (US); Thomas D. Pahel, Jr., Raleigh, NC (US); Adam J. Parker, Cary, NC (US); Adrian X. Rodriguez, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 453 days.

(21) Appl. No.: 13/335,281

(22) Filed: Dec. 22, 2011

(65) Prior Publication Data

US 2013/0162241 A1 Jun. 27, 2013

(51) Int. Cl.
*G01R 23/14* (2006.01)

(52) U.S. Cl.
USPC ........................................ 324/76.41; 324/520

(58) Field of Classification Search
CPC .............. G01R 29/0814; H01L 23/576; H01L 2924/14; H01L 2924/19105; H01L 2223/6677
See application file for complete search history.

(56) References Cited

U.S. PATENT DOCUMENTS

| | | | |
|---|---|---|---|
| 7,269,151 B2 | 9/2007 | Diener et al. | |
| 7,339,388 B2* | 3/2008 | Aghababazadeh et al. | 324/750.3 |
| 7,355,417 B1* | 4/2008 | Shusterman et al. | 324/754.21 |
| 7,496,466 B2* | 2/2009 | Farkas | 702/117 |
| 7,554,352 B2* | 6/2009 | Huie | 324/762.02 |
| 7,724,717 B2 | 5/2010 | Porras et al. | |
| 8,242,793 B2* | 8/2012 | Kumhyr et al. | 324/750.3 |
| 2004/0107219 A1 | 6/2004 | Rosenberger | |
| 2004/0166818 A1 | 8/2004 | Karlsson | |
| 2008/0102797 A1 | 5/2008 | Coleman et al. | |
| 2010/0050259 A1 | 2/2010 | Christofferson et al. | |

OTHER PUBLICATIONS

Brik et al., "Wireless Device Identification with Radiometric Signatures", MobiCom'08, Sep. 14-19, 2008, San Francisco, California, pp. 116-127.

Hall et al., "Detecting Rogue Devices in Bluetooth Networks Using Radio Frequency Fingerprinting", School of Computer Science, Carleton University, 1125 Colonel by Drive, Ottawa, Ontario, Canada, Oct. 2006, 6 pages.

Hall et al., "Detection of rogue devices in Wireless Networks", A thesis submitted to the Faculty of Graduate Studies and Research, Ottawa-Carleton Institute for Computer Science, School of Computer Science, Carleton University Ottawa, Ontario, Aug. 2006, pp. i-xvii and pp. 1-276.

Hall et al., "Radio Frequency Fingerprinting for Intrusion Detection in Wireless Networks", Manuscript received Jul. 2005, IEEE Transactions on Dependable and Secure Computing, pp. 1-35.

* cited by examiner

*Primary Examiner* — Minh N Tang (74) *Attorney, Agent, or Firm* — Katherine S. Brown; Jeffrey L. Streets (57) ABSTRACT

A method of testing an electronic device includes measuring radio frequency emissions at a plurality of positions relative to a trusted unit of a particular electronicdevice during operation of the trusted unit, and measuring radio frequency emissions at the same plurality of positions relative to a second unit of the particular electronic device. For each of the plurality of positions, the radio frequency emissions measured from the second unit are compared to the radio frequency emissions measured from the trusted unit. The method then determines whether there is any frequency at which the measured amplitude of the radio frequency emissions from the second unit and the measured amplitude of the radio frequency emissions from the trusted unit exhibit a statistically significant difference.

21 Claims, 4 Drawing Sheets

DETECTING MALICIOUS HARDWARE BY MEASURING RADIO FREQUENCY EMISSIONS

BACKGROUND OF THE INVENTION

1. Field of the Invention

The present invention relates to methods of testing electronic hardware.

2. Background of the Related Art

Electronic devices and systems may include any number of electronic components. A common printed circuit board may include tens or hundreds of individual components, and each component may have a design with significant complexity. Although great effort and care may go into designing an electronic device, the individual components may be designed and manufactured by many different companies, and the electronic device may be assembled under various degrees of supervision and security. As a result of the many potential variations that could exist in an electronic device made under a given product specification, it is recommended and often necessary to test some or all of the electronic devices received from an outside source before putting those electronic devices into service.

While some deviations may naturally or accidentally exist between two units of the same electronic device, it has also been found that some electronic devices may have been intentionally altered without authority. For example, the electronic device may include additional or modified electronic components that bypass security measures or enable unauthorized communications. These types of differences in the electronic device may not be easily detected through visual inspection or existing quality control techniques.

The issue of verifying that a particular unit of an electronic device complies with its design specification takes on a heightened importance in military applications, for example. Although the electronic device is to be used in a secure and trusted environment, the electronic device was most likely made or assembled in a non-trusted environment.

BRIEF SUMMARY OF THE INVENTION

One embodiment of the present invention provides a method of testing an electronic device. The method comprises measuring radio frequency emissions at a plurality of positions relative to a trusted unit of a particular electronic device during operation of the trusted unit, and measuring radio frequency emissions at the same plurality of positions relative to a second unit of the particular electronic device. For each of the plurality of positions, the radio frequency emissions measured from the second unit are compared to the radio frequency emissions measured from the trusted unit. The method then determines whether there is any frequency at which the measured amplitude of the radio frequency emissions from the second unit and the measured amplitude of the radio frequency emissions from the trusted unit exhibit a statistically significant difference.

Another embodiment of the present invention provides a computer program product including computer usable program code embodied on a computer usable medium. The computer program product includes computer usable program code for measuring radio frequency emissions at a plurality of positions relative to a trusted unit of a particular electronic device during operation of the trusted unit, and computer usable program code for measuring radio frequency emissions at the same plurality of positions relative to a second unit of the particular electronic device. The computer program product further includes computer usable program code for comparing, for each of the plurality of positions, the radio frequency emissions measured from the second unit to the radio frequency emissions measured from the trusted unit. Computer usable program code may also determine whether there is any frequency at which the measured amplitude of the radio frequency emissions from the second unit and the measured amplitude of the radio frequency emissions from the trusted unit exhibit a statistically significant difference.

DETAILED DESCRIPTION OF THE INVENTION

One embodiment of the present invention provides a method of testing an electronic device. The method comprises measuring radio frequency emissions at a plurality of positions relative to a trusted unit of a particular electronic device during operation of the trusted unit, and measuring radio frequency emissions at the same plurality of positions relative to a second unit of the particular electronic device. For each of the plurality of positions, the radio frequency emissions measured from the second unit are compared to the radio frequency emissions measured from the trusted unit. The method then determines whether there is any frequency at which the measured amplitude of the radio frequency emissions from the second unit and the measured amplitude of the radio frequency emissions from the trusted unit exhibit a statistically significant difference.

The trusted unit of the electronic device may, for example, be a prototype unit that was manufactured in a trusted environment or under close supervision and control. Alternatively, the trusted unit may be a unit of the electronic device from an untrusted source after extensive testing, perhaps including x-rays of the electronic device or the individual components. Still further, an electronic device might become trusted after some combination of process control, workload testing, and x-rays of components that are difficult to test otherwise.

Once a trusted unit of the electronic device has been identified, operation of the trusted unit will cause radio frequency signals to be emitted at different frequencies. The frequencies emitted and the amplitude of the emitted frequencies are a function of the speed, strength, and type of signals used by the electronic device. Individual components may also have unique radio frequency signatures depending on their operation. An enclosure is typically added around one or more electronic devices in order to dampen the radio frequency emissions and prevent electromagnetic interference with nearby devices. However, for the purpose of measuring the radio frequency emissions from an electronic device, it is preferable to open the enclosure, or remove the electronic device from the enclosure, so that a frequency sensitive antenna can be positioned closer to the individual components. Positioning of the antenna in close proximity to the electronic device improves the measurement of the radio frequency emissions because the emissions are stronger at a short distance and it is possible to measure the radio frequency emissions of an individual component.

In one embodiment, measuring radio frequency emissions includes measuring the amplitude of energy emitted at each of a plurality of frequencies. Accordingly, the plurality of frequencies may be a subset of all radio frequencies, which technically range from about 3 kHz to about 300 GHz. In fact, the plurality of frequencies may be those shown over time to identify the presence or absence of specific components on interest. The amplitude of any particular frequency may be measured in units of dBµV/m, which is the electric field strength relative to 1 microvolt per meter. The collection of radio frequency measurements from a particular device may be referred to as the device's radio frequency signature or fingerprint.

It is preferable to operate the electronic device under a workload while the radio frequency emissions are being measured. The workload may be, for example, a fixed percentage of the maximum nominal workload of the electronic device. A high percentage, such as 90 percent of the maximum nominal workload, will cause greater radio frequency emissions. In a further option, each unit of the electronic device being tested is made to run the same portion of the workload while measuring the radio frequency emissions at each of the plurality positions. This level of control helps to assure that a detected difference in radio frequency emissions between the trusted device and the device under test is not merely attributable to some fluctuation in the workload. One non-limiting example of a workload includes reading or writing to a segment of the hardware that is near a current position where the radio frequency emissions are being measured. For the purpose of maximizing confidence in the authenticity of an electronic device under test, emissions should be measured at each point for as many modes of operation as possible. The radio frequency emissions will be different when the device is first being booted up than when the device is operating at steady state. Accordingly, the present methods are the most thorough when each measurement point is collects data that represent all possible operating conditions. However, it is also possible to perform a quick, repeatable test by measuring the radio frequency emissions as the antenna is moved slowly across the device under test, using the same path in space at the same speed and synchronizing the operational state of the device.

Measuring the radio frequency emissions may include positioning a frequency sensitive antenna at the plurality of positions relative to the electronic device. This positioning may include continuous movement of the frequency sensitive antenna along a known path. Alternatively, the frequency sensitive antenna may be positioned using incremental movement to each of the plurality of positions, where the antenna pauses to measure the radio frequency emissions. It should be recognized that the relative movement may be achieve by moving the antenna, moving the electronic device, or moving both the antenna and the electronic device. In one option, the plurality of positions lie in a plane adjacent the electronic device. In a further option, a plurality of frequency sensitive antennas may be used to simultaneously measure radio frequency emissions at two or more of the plurality of positions.

Since the intent of the method is to measure the radio frequency emissions from the electronic device, the electronic device is preferably either removed from any enclosure or the enclosure is at least opened to expose the electronic device prior to measuring the radio frequency emissions. Many enclosures are designed to prevent radio frequency emissions from being transmitted outside the enclosure and may severely limit the ability to measure the emissions effectively. Furthermore, the enclosure may prevent the antenna from getting very close to the individual components of the electronic device.

In a further embodiment, the radio frequency emissions measurement may be repeated at any of the plurality of positions as a function of time. The measurements may be made at different times to prevent workload fluctuations from cause a false comparison to be made, such as either a device under test being identified as trusted when it is not or the device under test being identified as malicious when it is not. Furthermore, even during the development of a standard of radio frequency emissions from a trusted unit of the device, it may be desirable to measure emissions at the plurality of positions relative to a plurality of trusted units of the electronic device. With data collected from a plurality of trusted units, a standard or baseline of radio frequency emissions may be created based upon the radio frequency emissions measured from the plurality of trusted electronic devices. For example, the standard may be the average of measurements from all the trusted devices, or some statistical sampling that throws out the measurements from one or two trusted devices where their measurements are anomalies.

In a further embodiment, the radio frequency measurements and comparisons may be used to identify a component on the second unit of the electronic device (i.e., the device under test) as being suspicious. For example, upon determining that the radio frequency emissions measured at a particular position or coordinates on the second unit are different than the radio frequency emissions measured at the same position or coordinates from the trusted unit, components near those coordinates may be identified as suspicious, since counterfeit or malicious components, or components with additional unknown capacity, will emit a different radio frequency signature. Furthermore, it may be desirable to take further measurements in the vicinity of those coordinates, such as by following a tighter localized grid, in order to determine which of two or more nearby components are responsible for the suspicious emissions.

Figure 1:
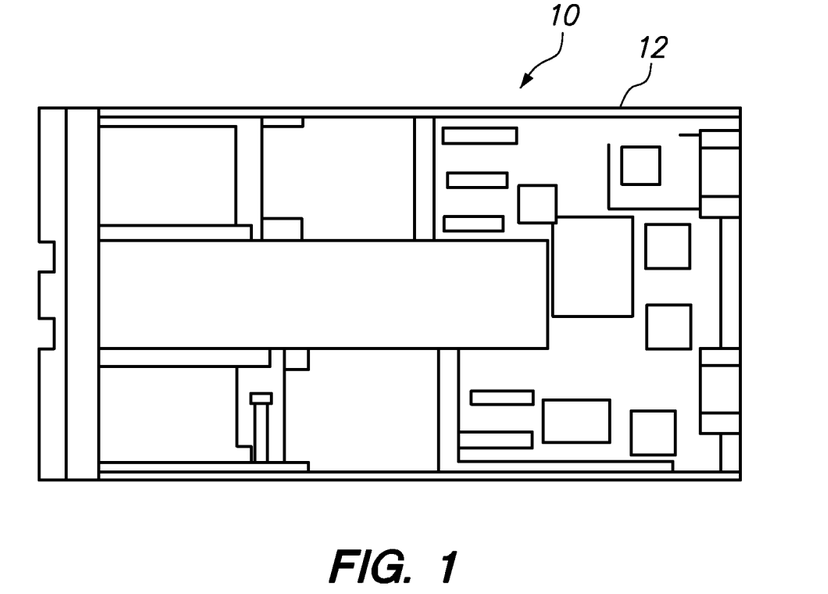
FIG. 1 is a plan view of a computer motherboard.

FIG. 1 is a plan view of a computer motherboard or an entire server 10 including components that are not formally part of the motherboard 12. The computer motherboard is itself a complex electronic device that includes a large number of components and component types. For example, the motherboard may include a hard disk drive, a number of dual in-line memory modules (DIMMs), two processors, a flash drive, and an input/output adapter. Here, the server enclosure has been opened up to allow access to the electronic components on the motherboard. A frequency sensitive antenna can easily positioned at any number of positions across the motherboard. The radio frequency emissions may be measured at each of these positions. Accordingly, the radio frequency emissions of a trusted unit of the motherboard can be compared to the radio frequency emissions of other motherboards in order to verify that they do not contain out-of-spec, extraneous, or malicious hardware.

Figure 2:
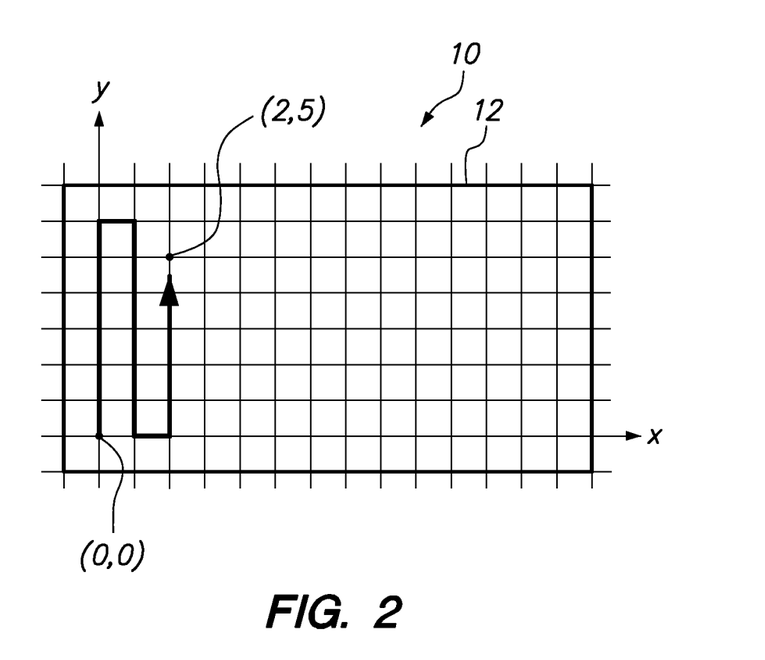
FIG. 2 is an outline of the computer motherboard of FIG. 1 overlaid with a coordinate grid.

FIG. 2 is an outline of the computer motherboard 12 of FIG. 1 overlaid with a coordinate grid. The grid represents one embodiment for controlling the movement of an antenna relative to the motherboard, and may be described by an x-axis, a y-axis, and an origin having coordinates (0,0). For example, the antenna may be positioned at the intersection of one horizontal line and one vertical line (a "measurement position") in FIG. 2 to measure the radio frequency emissions at that position. Once the radio frequency emissions have been measured, the antenna is indexed to the next measurement position. This process may be repeated until the antenna has measured the radio frequency emissions at all of the desired measurement points. The dark line with an arrow is just one representation of a path along which the antenna may be moved. Other coordinate systems and other pathways may be followed. The measurement points may also be a more specifically selected group of positions that correspond to the individual components on the motherboard. It is also possible to take a continuous measurement of radio frequency emissions as the antenna moves across the motherboard. The antenna movement may be automated for consistent and repetitive testing from one motherboard to the next. It should also be recognized that the same relative movement may be achieved by moving the motherboard and keeping the antenna in one place.

Figure 3:
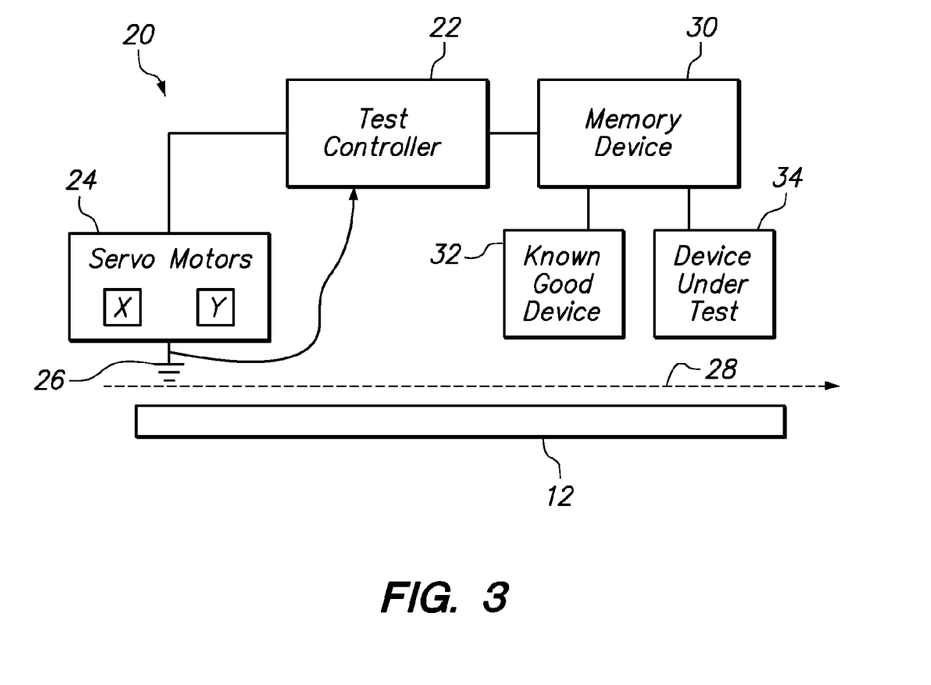
FIG. 3 is a schematic diagram of a system for measuring radio frequency emissions from a device, such as the computer motherboard of FIG. 1.

FIG. 3 is a schematic diagram of a system 20 for measuring radio frequency emissions from a device, such as the computer motherboard 12 of FIG. 1. A test controller 22 provides control signals to a pair of servo motors 24 that control movement of an antenna 26 within a plane 28. As shown, an x-axis runs from left to right. There is also a y-axis that would extend in and out of the page, consistent with the coordinate grid of FIG. 2. At each desired measurement position, or along a measurement path, the antenna 26 measures the radio frequency emissions of the motherboard 12 and communicates those measurements to the test controller 22.

A memory device 30 stores the radio frequency emissions for a "known good device", which is a trusted motherboard of the same design as the motherboard under test. The memory device 30 is shown including optional storage for the radio frequency emission measurements of the "device under test" (memory 32), which is the motherboard shown in FIG. 3. If the radio frequency measurements can be compared in real time, then storage of measurements for the "device under test" is not necessary. However, the comparison may be computationally intensive, such that it would be preferable to store the measurements for the "device under test" (memory 34), at least temporarily until reaching a conclusion regarding the authenticity of the device.

Figure 4:
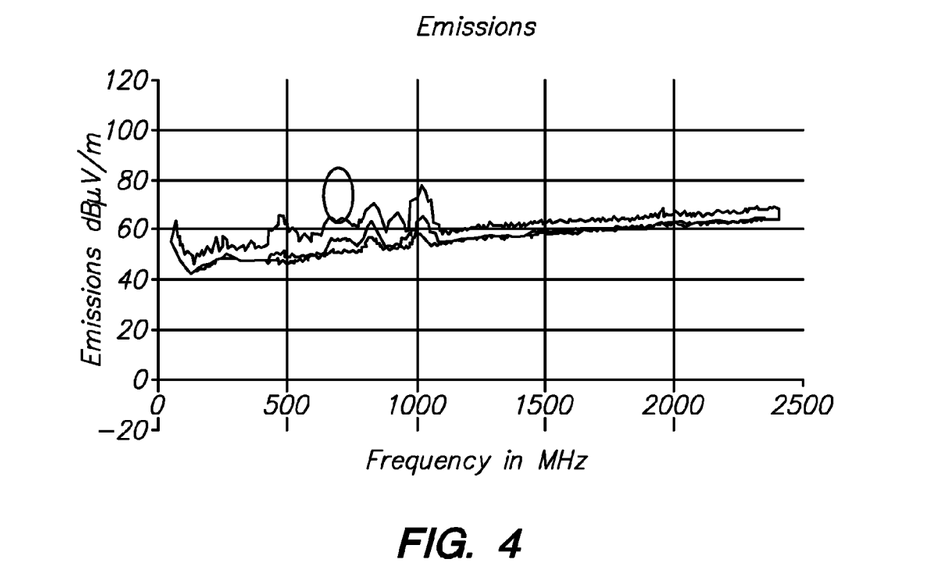
FIG. 4 is a chart of radio frequency emissions measured from a known good device with an antennae at a specific known position with respect to the device.

FIG. 4 is a chart of radio frequency emissions measured from a known good device with an antennae at a specific known position with respect to the device. For example, the chart may represent the radio frequency emissions measured from the know good device at coordinates (2,5). The chart of FIG. 4 plots the various frequencies of the emissions on the x-axis and the amplitude of the emissions (i.e., the strength of the emissions) on the y-axis. Variations in the amplitude of the emissions are a characteristic of the electronic components near coordinates (2,5) on the known good motherboard when operating under a given workload. Because the number and types of components vary across the motherboard, a similar chart of radio frequency emissions measured at a different position relative to the motherboard is likely to have different amplitudes at one or more of the frequencies.

Figure 5:
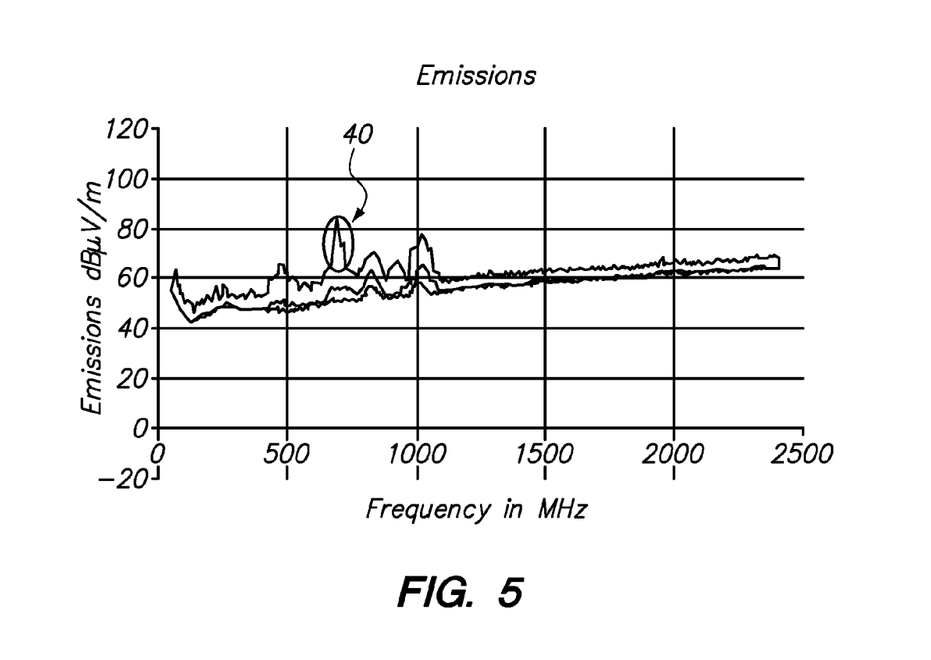
FIG. 5 is a chart of radio frequency emissions measured from a device under test with the antennae at the same specific known position with respect to the device.

FIG. 5 is a chart of radio frequency emissions measured from a device under test with the antennae at the same specific known position (coordinates (2,5)) with respect to the device under test. As in FIG. 4, the chart plots emission amplitude (on the y-axis) as a function of the frequency (on the x-axis). Since the chart data is generated from the same measurements at the same position on a motherboard allegedly of the same design, and preferably under the same workload during the measurement, the chart for the device under test in FIG. 5 is compared to the chart for the known good device in FIG. 4. If the components in the area of the motherboard immediately adjacent the antenna at position (2,5) are the same, then the radio frequency emissions should be the same. However, the chart in FIG. 5 has a sharp peak 40 (circled) near 700 MHz that reaches 80 dBµV/m, which peak does not appear on the chart of FIG. 4 (See the circle in FIG. 4 highlighting the absence of a peak in the same location of the chart). Although minor variations might be natural, the difference here may be determined to be greater than a predetermined set point. Specifically, at about 700 MHz, the measured amplitude of the emissions from the second unit and the measured amplitude of the emissions from the trusted unit exhibit a statistically significant difference. Accordingly, the device under test may be flagged as suspicious and either discarded or subjected to further testing, such as x-ray imaging. Since the suspicious emissions were measured at position (2,5), one or more components near that position are likely to be responsible for those emissions and any further investigation would naturally start with those components.

In one embodiment, the criteria for identifying a suspicious device or component may be a predetermined set point difference in the amplitude of the emissions at one or more frequencies. For example, a suspicious device alert could be triggered any time the difference between the measured amplitude of the emissions from the second unit and the measured amplitude of the emissions from the trusted unit is more than 5 dBµV/m. This could include situations where the second unit had emissions at 700 MHz with an amplitude that was more than 5 dBµV/m greater, or more than 5 dBµV/m less, than the amplitude of emissions from the trusted unit at 700 MHz. As shown in FIGS. 4 and 5, the difference in the amplitude of emissions from the two devices at 700 MHz is about 10 dBµV/m. Accordingly, the second device that produced the emissions in FIG. 5 would still be identified as suspicious using, for example, either a 5 dBµV/m set point or even a 10 dBµV/m set point.

Figure 6:
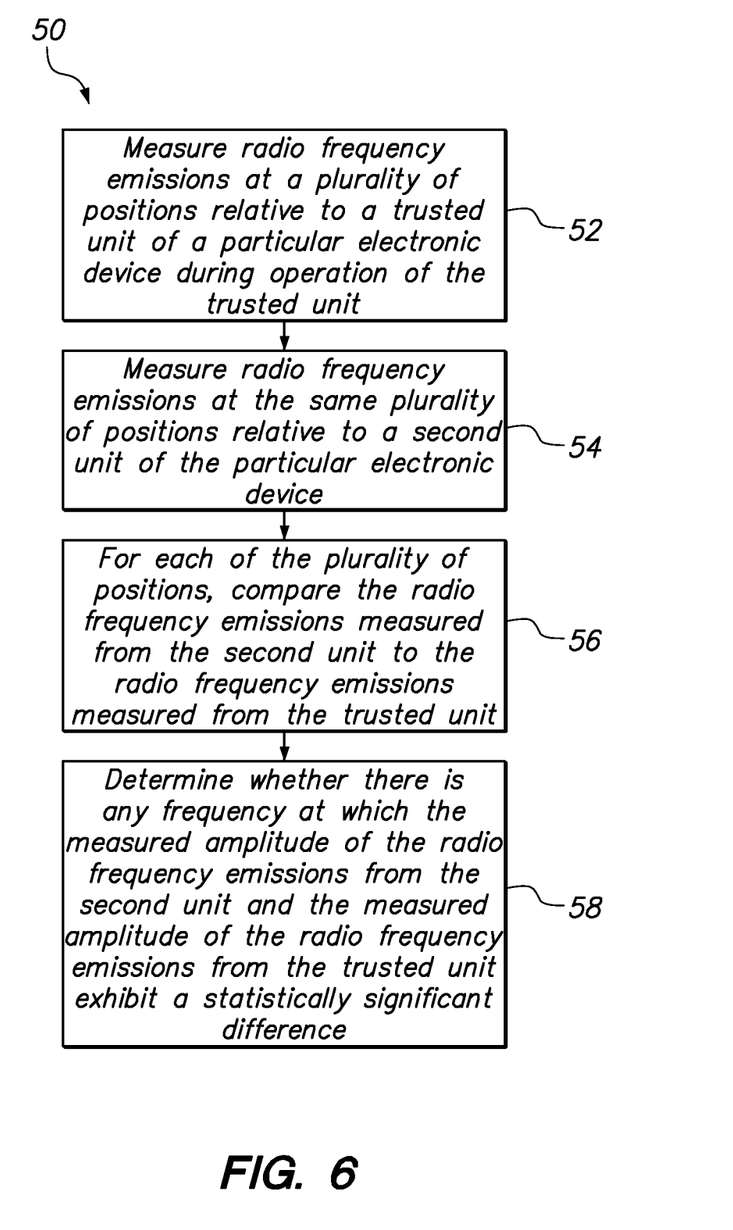
FIG. 6 is a flowchart of a method in accordance with one embodiment of the invention.

FIG. 6 is a flowchart of a method 50 in accordance with one embodiment of the present invention. In step 52, radio frequency emissions are measured at a plurality of positions relative to a trusted unit of a particular electronic device during operation of the trusted unit. In step 54, radio frequency emissions are measured at the same plurality of positions relative to a second unit of the particular electronic device. Then, for each of the plurality of positions, the radio frequency emissions measured from the second unit are compared to the radio frequency emissions measured from the trusted unit, per step 56. In step 58, it is determined whether there is any frequency at which the measured amplitude of the radio frequency emissions from the second unit and the measured amplitude of the radio frequency emissions from the trusted unit exhibit a statistically significant difference.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
measuring radio frequency emissions at a plurality of positions relative to a trusted unit of a particular electronic device during operation of the trusted unit;
measuring radio frequency emissions at the same plurality of positions relative to a second unit of the particular electronic device;
for each of the plurality of positions, comparing the radio frequency emissions measured from the second unit to the radio frequency emissions measured from the trusted unit; and
determining whether there is any frequency at which the measured amplitude of the radio frequency emissions from the second unit and the measured amplitude of the radio frequency emissions from the trusted unit exhibit a statistically significant difference.

2. The method of claim 1, wherein measuring radio frequency emissions at a plurality of positions relative to a trusted unit of a particular electronic device during operation of the trusted unit includes measuring the amplitude of energy emitted at each of a plurality of frequencies, and wherein measuring radio frequency emissions at the same plurality of positions relative to a second unit of the particular electronic device includes measuring the amplitude of energy emitted at each of a plurality of frequencies.

3. The method of claim 1, further comprising:
operating the trusted unit of the particular electronic device under a workload while the radio frequency emissions of the trusted unit are being measured; and
operating the second unit of the particular electronic device under the workload while the radio frequency emissions of the second unit are being measured.

4. The method of claim 3, wherein the workload is a fixed percentage of the maximum nominal workload of the trusted unit of particular electronic device and the second unit of the particular electronic device.

5. The method of claim 3, further comprising:
for the trusted unit of the particular electronic device and the second unit of the particular electronic device, running the same portion of the workload while measuring the radio frequency emissions at each of the plurality positions.

6. The method of claim 3, wherein operating the trusted unit of the particular electronic device under a workload while the radio frequency emissions of the trusted unit are being measured, includes reading or writing to a segment of the hardware of the trusted unit that is near a current position where the radio frequency emissions of the trusted unit are being measured; and
wherein operating the second unit of the particular electronic device under a workload while the radio frequency emissions of the second unit are being measured, includes reading or writing to a segment of the hardware of the second unit that is near a current position where the radio frequency emissions of the second unit are being measured.

7. The method of claim 1, further comprising:
positioning a frequency sensitive antenna at the plurality of positions relative to the electronic device.

8. The method of claim 7, wherein the plurality of positions lie in a plane adjacent the electronic device.

9. The method of claim 7, wherein positioning the frequency sensitive antenna at the plurality of positions relative to the electronic device includes continuous movement of the frequency sensitive antenna along a known path.

10. The method of claim 7, wherein positioning the frequency sensitive antenna at the plurality of positions relative to the electronic device includes incremental movement of the frequency sensitive antenna to each of the plurality of positions and pausing movement to measure the radio frequency emissions of the electronic device.

11. The method of claim 7, wherein positioning the frequency sensitive antenna at the plurality of positions relative to the electronic device includes moving the electronic device.

12. The method of claim 1, further comprising:
using a plurality of frequency sensitive antennas to simultaneously measure radio frequency emissions of the electronic device at two or more of the plurality of positions.

13. The method of claim 1, further comprising:
removing the electronic device from any enclosure prior to measuring the radio frequency emissions of the electronic device.

14. The method of claim 1, wherein the electronic device includes a circuit board.

15. The method of claim 1, further comprising:
repeating measurement of the radio frequency emissions of the electronic device at any of the plurality of positions as a function of time.

16. The method of claim 15, wherein measuring radio frequency emissions at a plurality of positions relative to a trusted unit of a particular electronic device during operation of the trusted unit, includes measuring radio frequency emissions at the plurality of positions relative to a plurality of trusted units of the electronic device.

17. The method of claim 16, further comprising:
creating the radio frequency emissions standard based upon the radio frequency emissions measured from the plurality of trusted electronic devices.

18. The method of claim 1, further comprising:
identifying a component on the second unit of the electronic device as being suspicious in response to determining that the radio frequency emissions measured at a position adjacent the component on the second unit are different than the radio frequency emissions measured at the same position adjacent the same component on the trusted unit.

19. The method of claim 1, wherein determining whether there is any frequency at which the measured amplitude of the radio frequency emissions from the second unit and the measured amplitude of the radio frequency emissions from the trusted unit exhibit a statistically significant difference, includes determining whether there is any frequency at which the measured amplitude of the radio frequency emissions from the second unit are more than 5 dBµV/m greater than the measured amplitude of the radio frequency emissions from the trusted unit.

20. A computer program product including computer usable program code embodied on a computer usable medium, the computer program product including:
computer usable program code for measuring radio frequency emissions at a plurality of positions relative to a trusted unit of a particular electronic device during operation of the trusted unit;
computer usable program code for measuring radio frequency emissions at the same plurality of positions relative to a second unit of the particular electronic device;
computer usable program code for comparing, for each of the plurality of positions, the radio frequency emissions measured from the second unit to the radio frequency emissions measured from the trusted unit; and computer usable program code for determining whether there is any frequency at which the measured amplitude of the radio frequency emissions from the second unit and the measured amplitude of the radio frequency emissions from the trusted unit exhibit a statistically significant difference.

21. The computer program product of claim 20, further comprising:

computer usable program code for operating the trusted unit of the particular electronic device under a workload while the radio frequency emissions of the trusted unit are being measured: and computer usable program code for operating the second unit of the particular electronic device under the workload while the radio frequency emissions of the second unit are being measured.

\* \* \* \* \*